(12) United States Patent
Kashihara et al.

(10) Patent No.: US 11,355,681 B2
(45) Date of Patent: Jun. 7, 2022

(54) LIGHT EMITTING DEVICE AND METHOD OF MANUFACTURING SAME

(71) Applicant: NICHIA CORPORATION, Anan (JP)

(72) Inventors: Shoichi Kashihara, Komatsushima (JP); Masanobu Sato, Tokushima (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 16/772,847

(22) PCT Filed: Nov. 29, 2018

(86) PCT No.: PCT/JP2018/044064
§ 371 (c)(1),
(2) Date: Jun. 15, 2020

(87) PCT Pub. No.: WO2019/150739
PCT Pub. Date: Aug. 8, 2019

(65) Prior Publication Data
US 2021/0175398 A1 Jun. 10, 2021

(30) Foreign Application Priority Data
Jan. 31, 2018 (JP) ................ JP2018-014385

(51) Int. Cl.
*H01L 33/58* (2010.01)
*H01L 33/00* (2010.01)
(Continued)

(52) U.S. Cl.
CPC ........... *H01L 33/58* (2013.01); *H01L 33/005* (2013.01); *H01L 33/50* (2013.01); *H01L 33/56* (2013.01); *H01L 2933/0058* (2013.01)

(58) Field of Classification Search
CPC ......... H01L 33/58; H01L 33/50; H01L 33/56; H01L 2933/0058
See application file for complete search history.

(56) References Cited

U.S. PATENT DOCUMENTS

2002/0190262 A1 12/2002 Nitta et al.
2004/0217369 A1* 11/2004 Nitta ................. H01L 25/167
257/99
(Continued)

FOREIGN PATENT DOCUMENTS

JP 2000-269555 A 9/2000
JP 2002-314143 A 10/2002
(Continued)

OTHER PUBLICATIONS

International Search Report, issued in PCT/JP2018/044064, dated Mar. 5, 2019.
(Continued)

*Primary Examiner* — Jay C Chang
*Assistant Examiner* — Mikka Liu
(74) *Attorney, Agent, or Firm* — Birch, Stewart, Kolasch & Birch, LLP

(57) ABSTRACT

A light emitting device including a fluorescent material with reduced hue, and a method of manufacturing the light emitting device are provided.

A light emitting device 100 includes: a light emitting element 1; a first light-transmissive member 3 covering the light emitting element 1; and a light diffusing member 5 contained in the first light-transmissive member 3. The light diffusing member 5 includes hollow particles. The surface of the first light-transmissive member 3 has irregular shapes attributed to the light diffusing member 5. The first light-transmissive member 3 is covered with a second light-transmissive member 4. The second light-transmissive member 4 has a convex structure in which the center is the uppermost point. The irregular shapes attributed to the light diffusing member 5 are covered with the second light-transmissive member 4.

14 Claims, 14 Drawing Sheets

(51) Int. Cl.
*H01L 33/50* (2010.01)
*H01L 33/56* (2010.01)

(56) References Cited

U.S. PATENT DOCUMENTS

| | | |
|---|---|---|
| 2007/0189007 A1 | 8/2007 | Nishimoto et al. |
| 2007/0228947 A1 | 10/2007 | Tanimoto et al. |
| 2010/0289048 A1 | 11/2010 | Kumura |
| 2012/0161621 A1* | 6/2012 | Sato ................ H01L 33/56 313/512 |
| 2017/0054110 A1 | 2/2017 | Racz et al. |
| 2017/0288104 A1 | 10/2017 | Ukawa et al. |

FOREIGN PATENT DOCUMENTS

| | | |
|---|---|---|
| JP | 2004-235261 A | 8/2004 |
| JP | 2005-311314 A | 11/2005 |
| JP | 2006-80334 A | 3/2006 |
| JP | 2008-516414 A | 5/2008 |
| JP | 4167717 B1 | 10/2008 |
| JP | 2009-182307 A | 8/2009 |
| JP | 2012-151466 A | 8/2012 |
| JP | 2014-138081 A | 7/2014 |
| JP | 2015-84384 A | 4/2015 |
| JP | 2016-72379 A | 5/2016 |
| JP | 2016-224338 A | 12/2016 |
| JP | 2017-515310 A | 6/2017 |
| JP | 2017-126045 A | 7/2017 |
| JP | 2017-183578 A | 10/2017 |
| JP | 2018-77324 A | 5/2018 |
| WO | WO 2009/066398 A1 | 5/2009 |
| WO | WO 2013/137079 A1 | 9/2013 |

OTHER PUBLICATIONS

Written Opinion of the International Searching Authority, issued in PCT/JP2018/044064, dated Mar. 5, 2019.

* cited by examiner

[FIG1A]
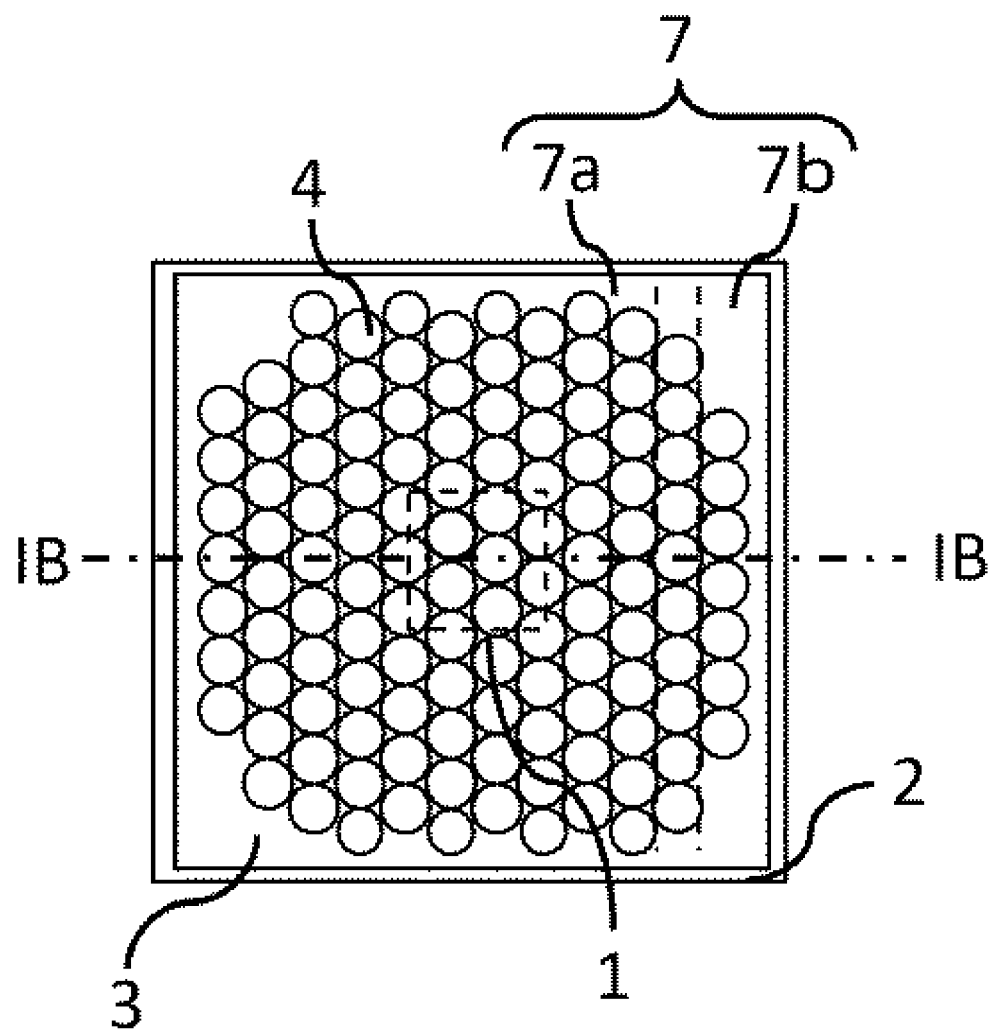

[FIG.1B]
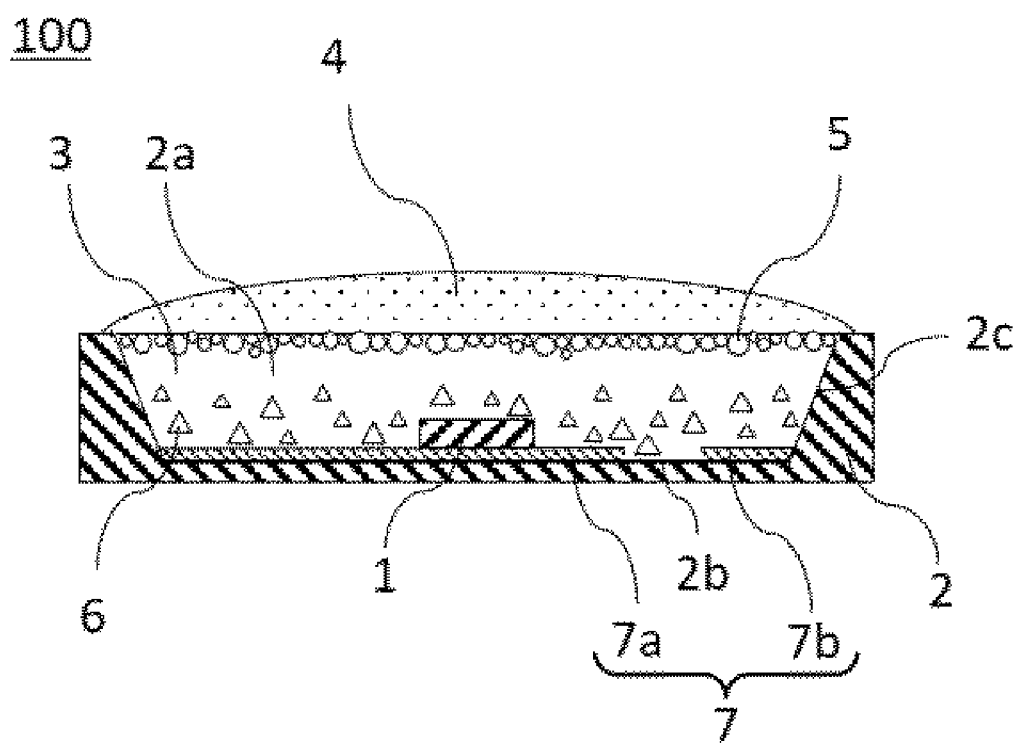

[FIG1C]
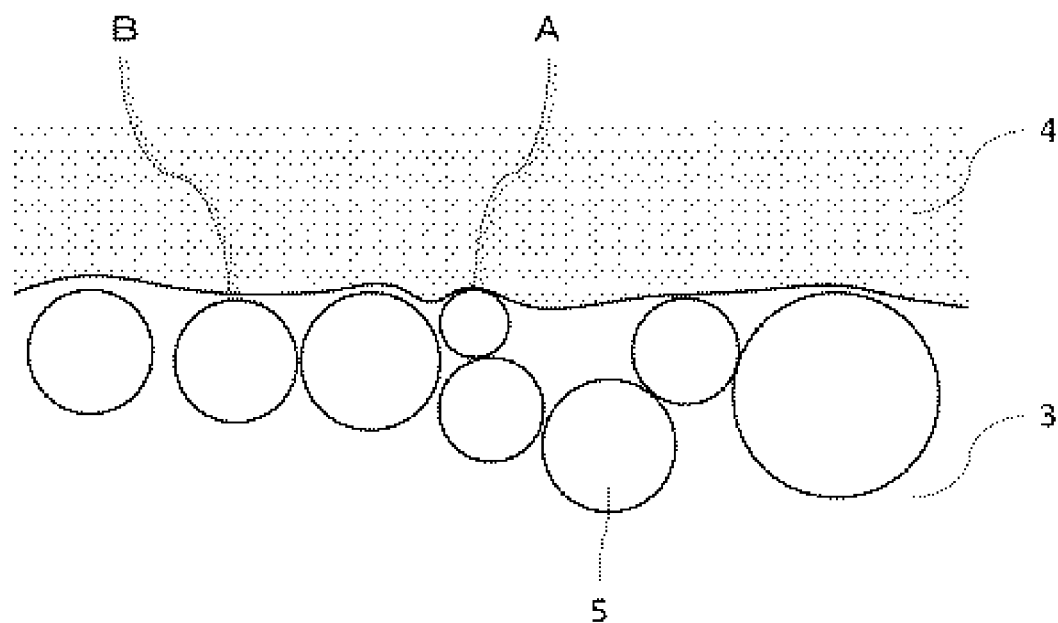

[FIG.2]
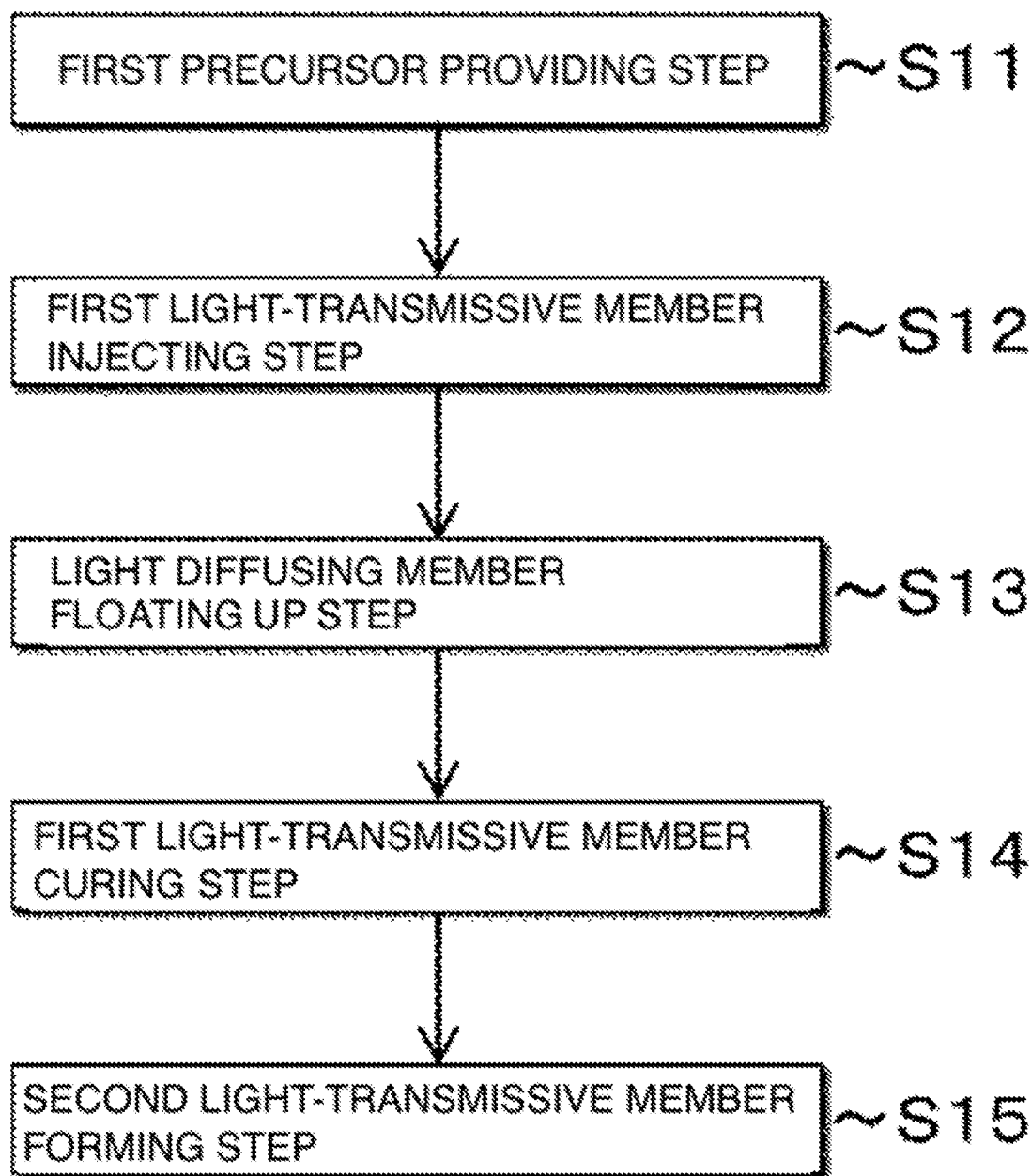

[FIG3A]
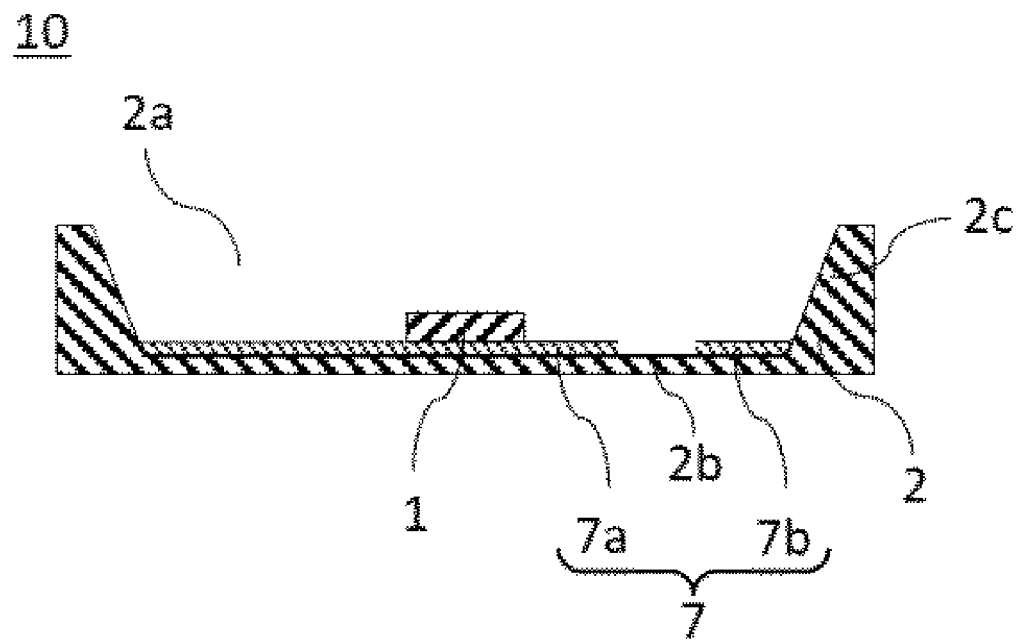

[FIG.3B]
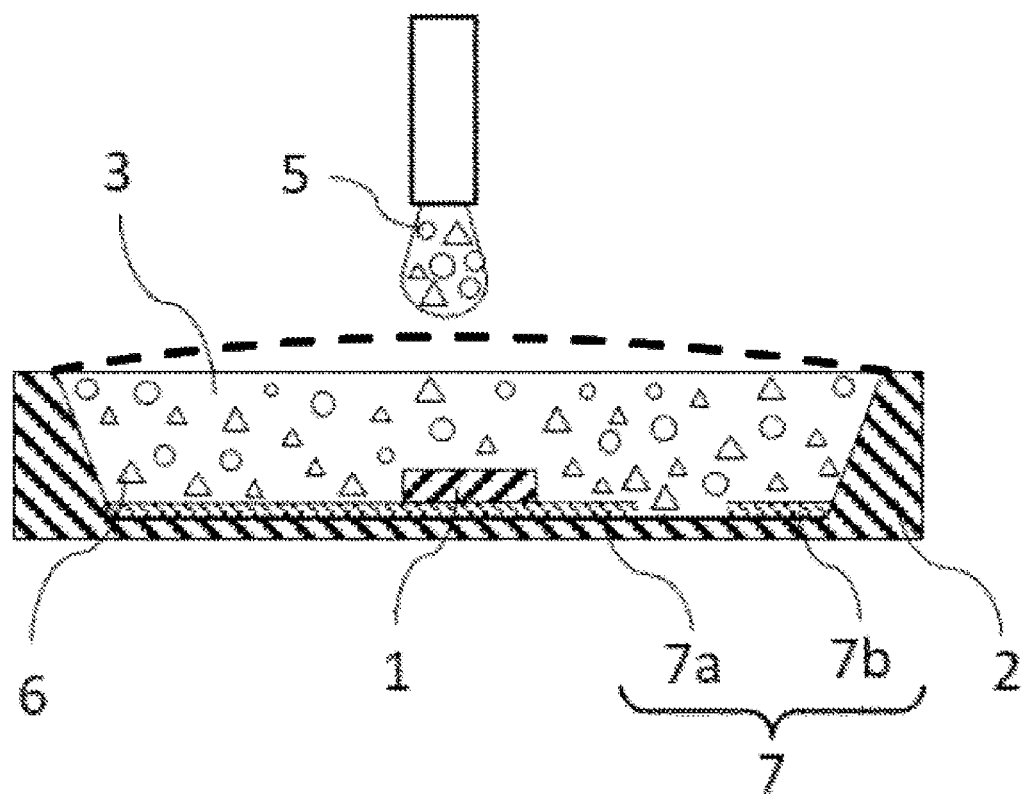
[FIG.3C]
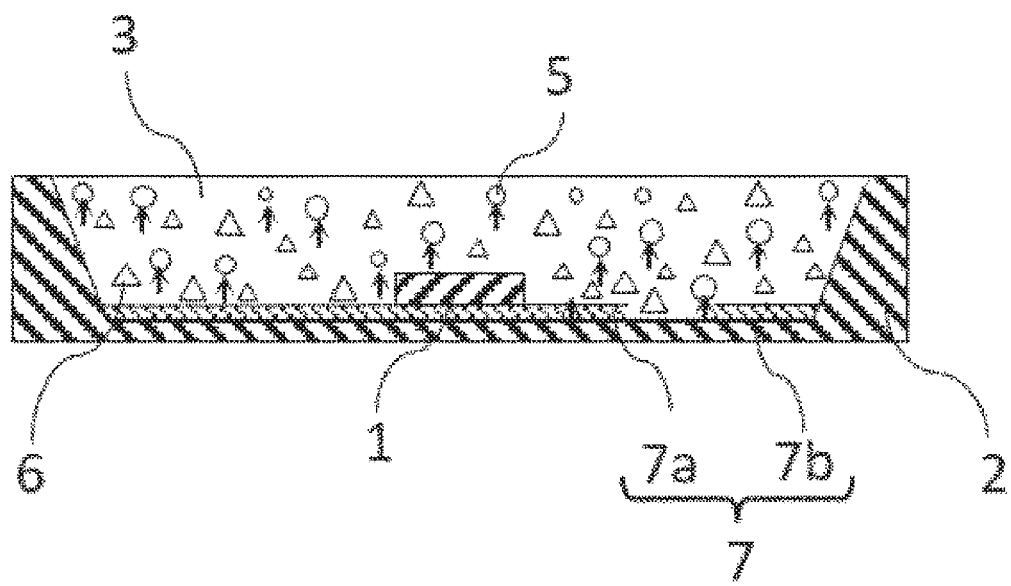

[FIG 3D]
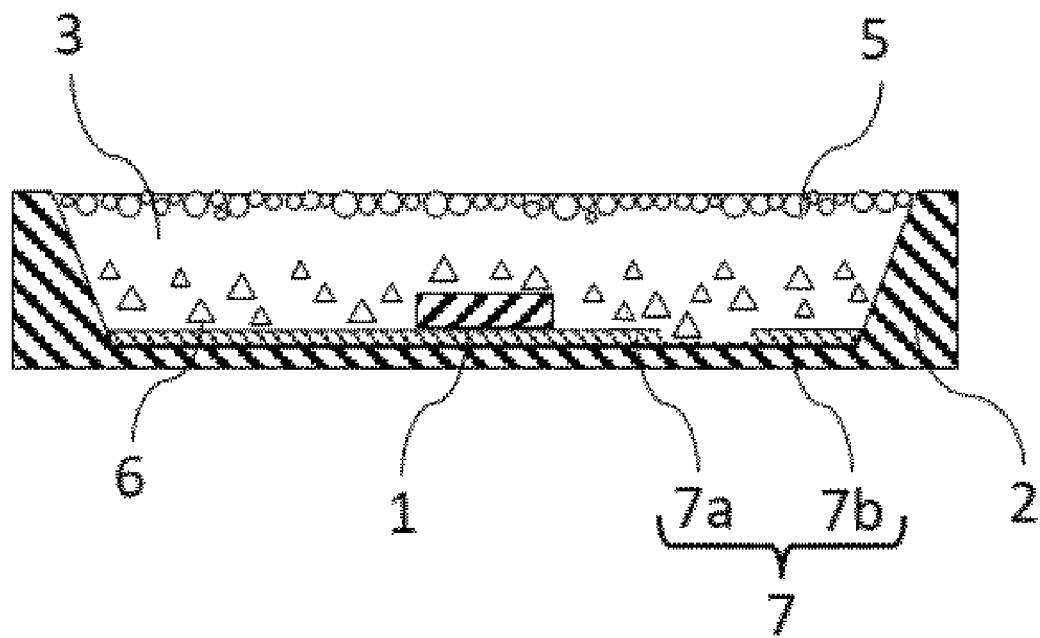

[FIG3E]
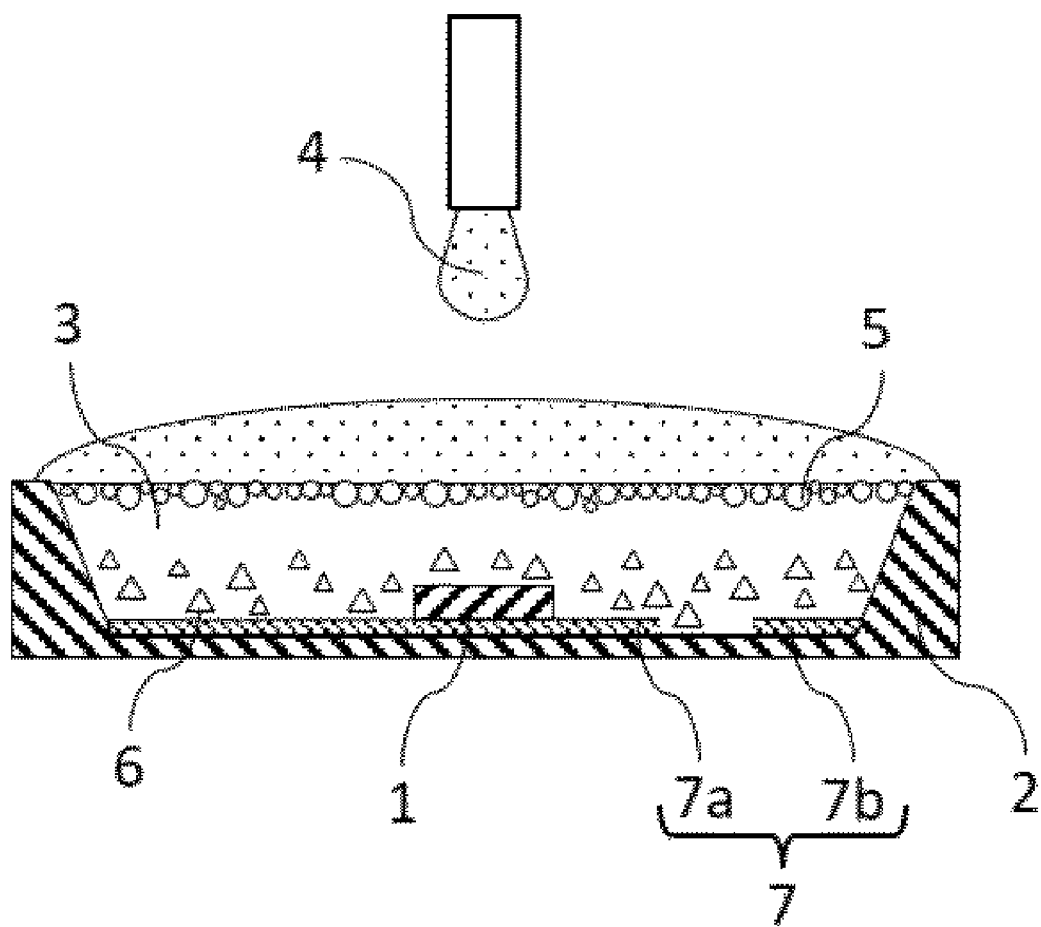

[FIG3F]
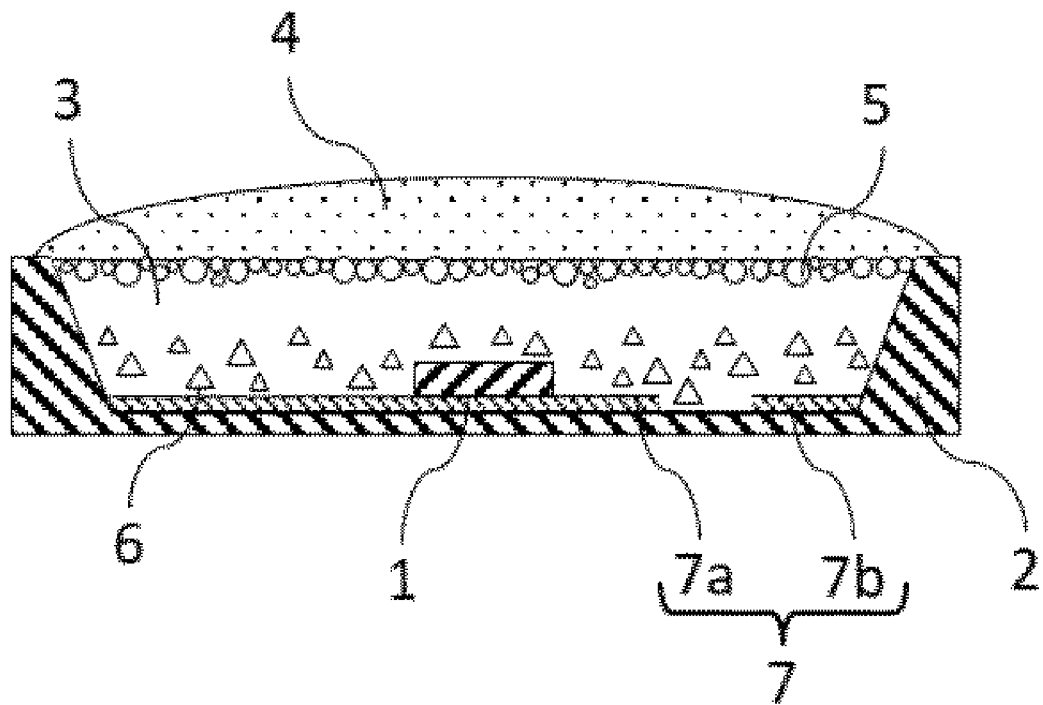
[FIG4A]
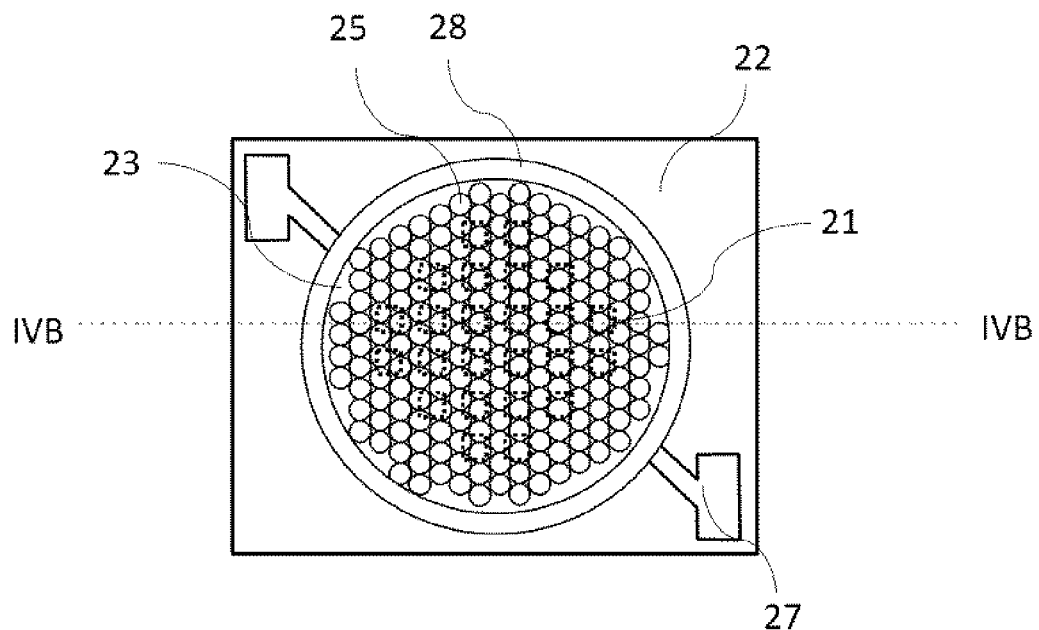

[FIG 4B]
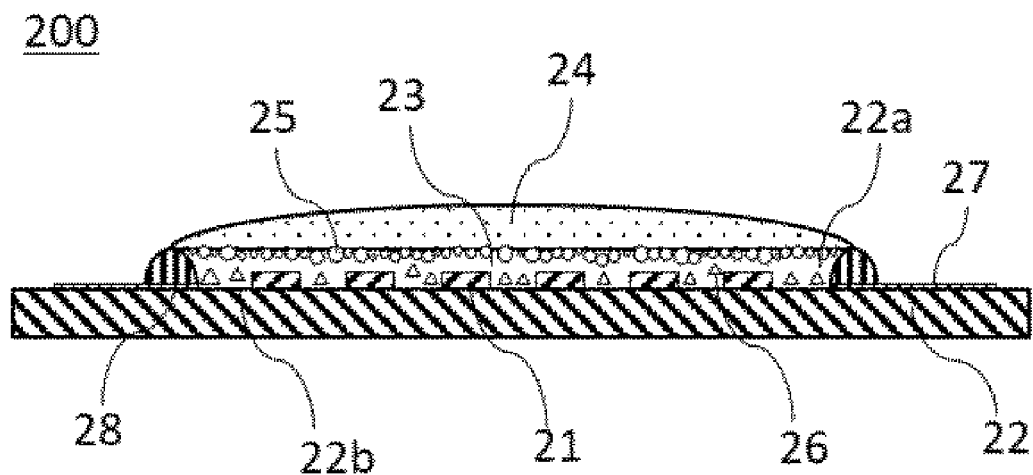
[FIG 4C]
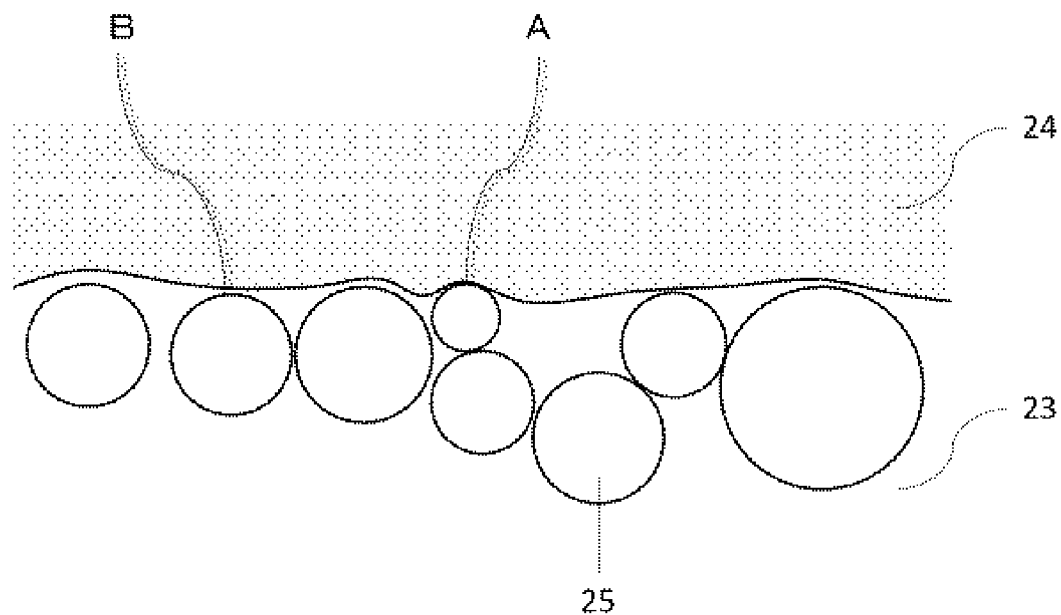

[FIG.5]
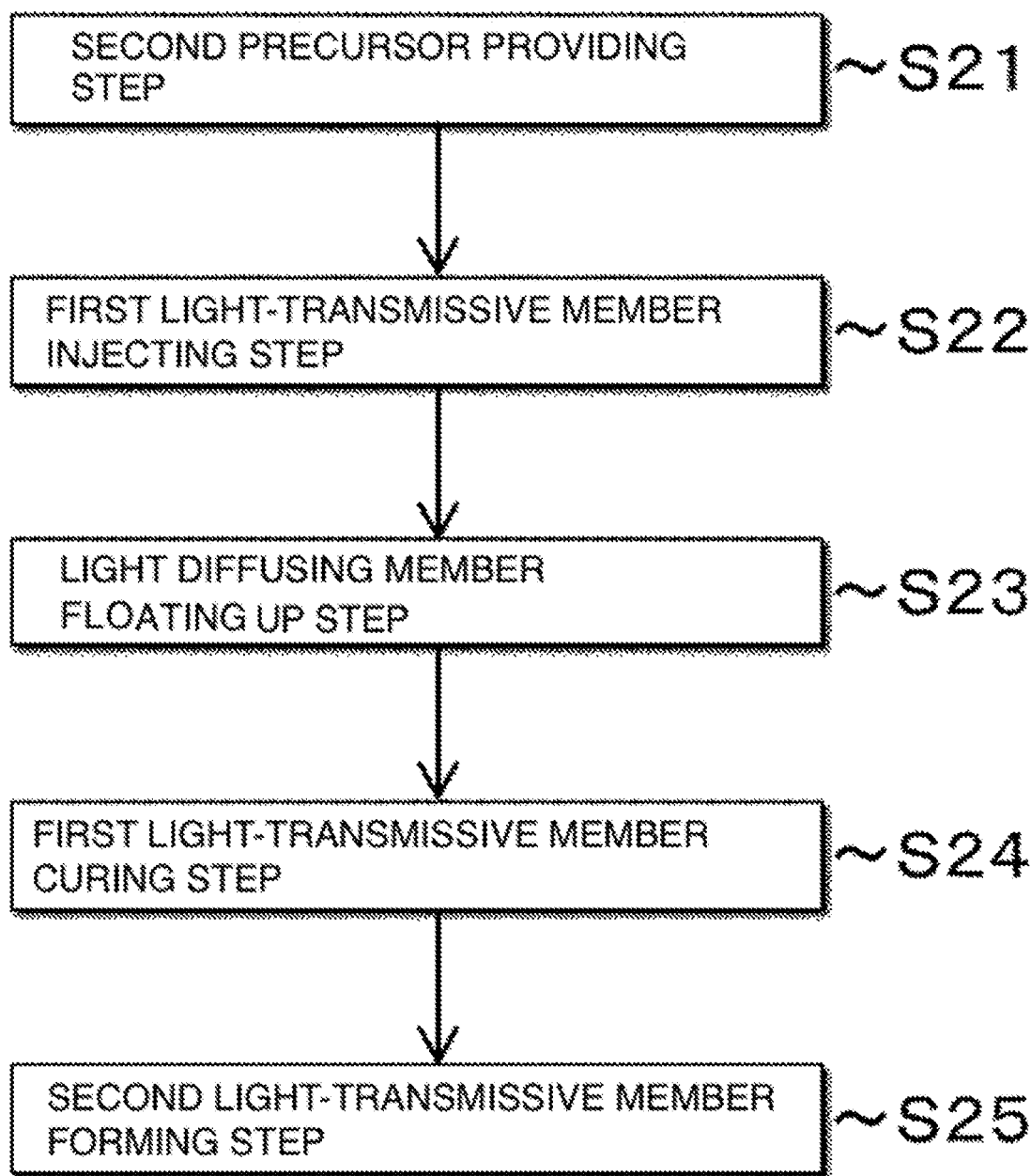

[FIG.6A]
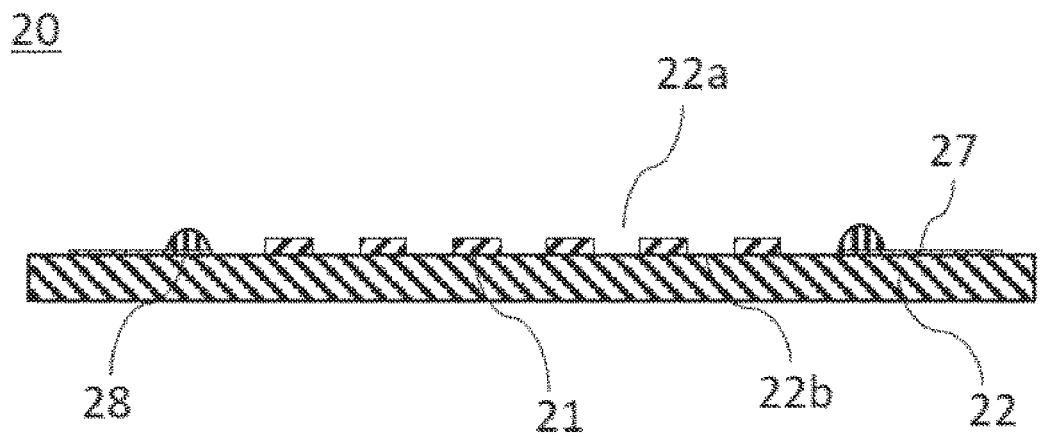
[FIG.6B]
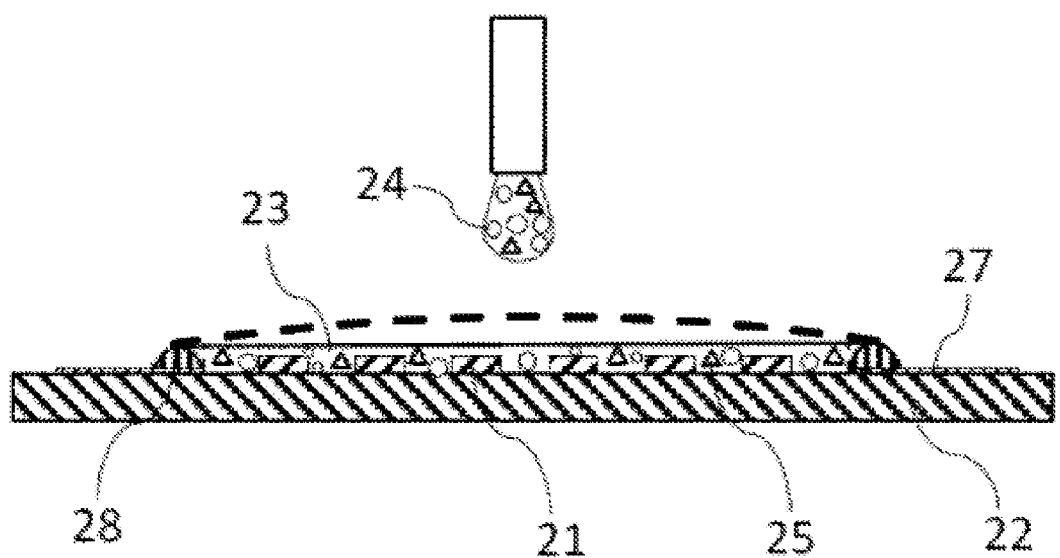

[FIG6C]
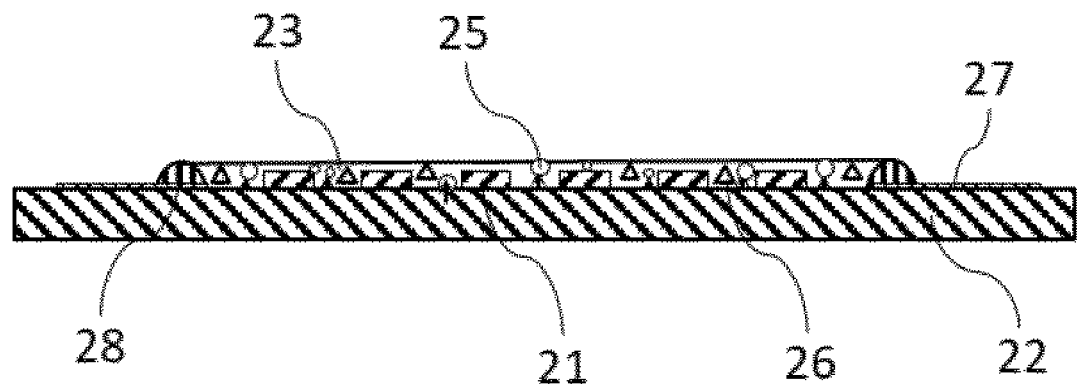
[FIG6D]
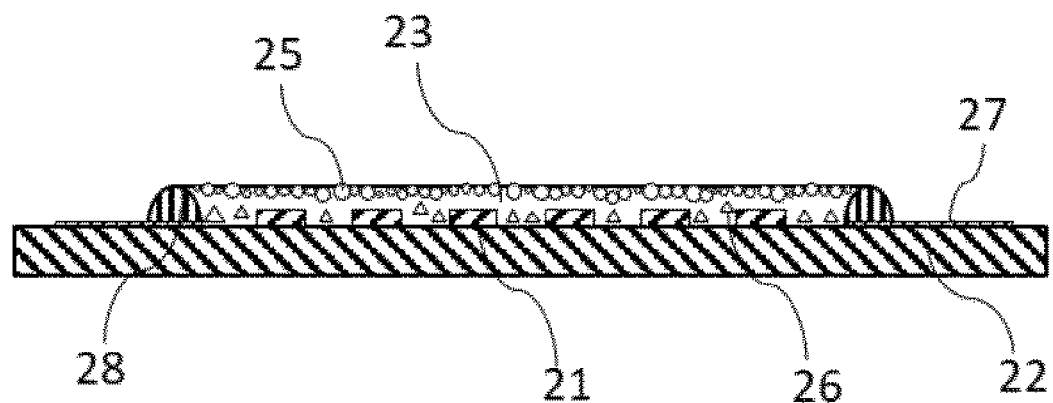

[FIG6E]
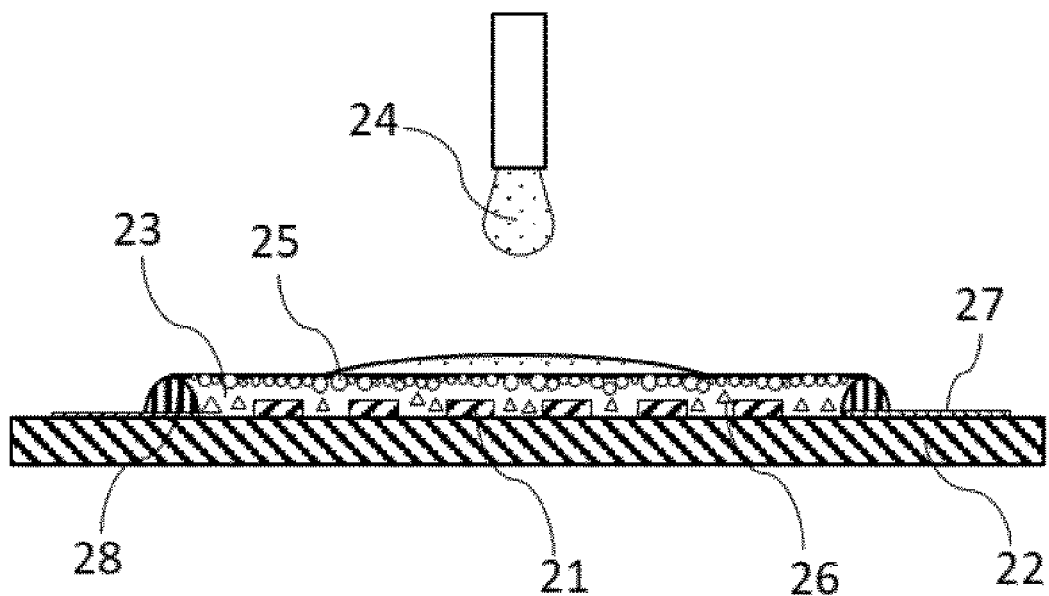
[FIG6F]
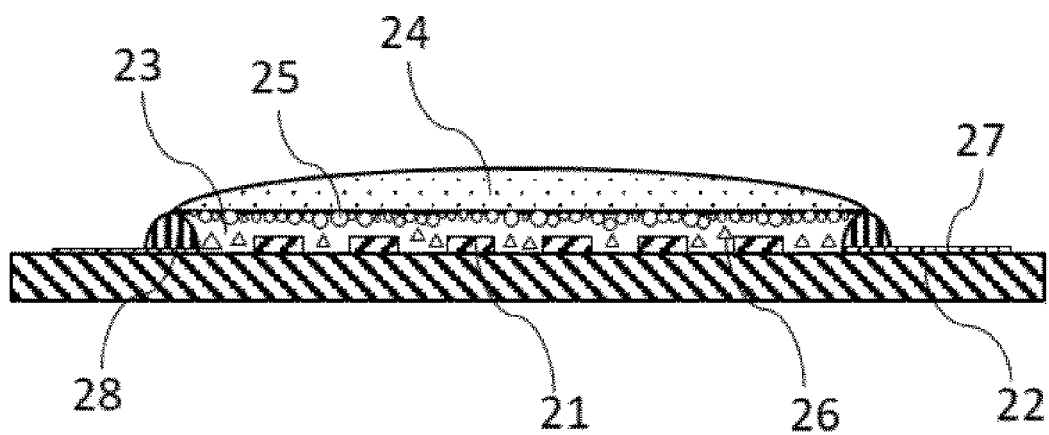

LIGHT EMITTING DEVICE AND METHOD OF MANUFACTURING SAME

TECHNICAL FIELD

The present disclosure relates to a light emitting device and a method of manufacturing the same.

BACKGROUND ART

Recent years have seen widespread use of white-color light emitting devices which employ a yellow-color fluorescent material, a red-color fluorescent material, or any other fluorescent material. Various studies have been made on improving light extraction efficiency or alleviating color unevenness.

Patent Document 1 discloses such a technique, in which light extraction efficiency and luminance are improved by provision of a convex projection at the surface of a sealing resin.

PRIOR ART DOCUMENT

Patent Document

Patent Document 1: JP 4167717 B

SUMMARY OF THE INVENTION

Problems to be Solved by the Invention

Here, in the light emitting device disclosed in Patent Document 1, the color of the fluorescent material is visible at the light emitting surface and, hence, the light emitting color and the object color are different. When mounted on a lighting fixture, the apparent object color in non-lighting mode may impair the design of the lighting fixture.

An object of the present disclosure is to render the object color at the light emitting surface uniform.

Solutions to the Problems

A light emitting device according to an embodiment of the present disclosure includes: a light emitting element; a first light-transmissive member covering the light emitting element; and a light diffusing member contained in the first light-transmissive member. The light diffusing member contains hollow particles. A surface of the first light-transmissive member has irregular shapes attributed to the light diffusing member. The first light-transmissive member is covered with the second light-transmissive member.

A method of manufacturing a light emitting device according to an embodiment of the present disclosure includes: providing a first precursor including a base member including a recess having an inner bottom surface, and a light emitting element mounted on the inner bottom surface; injecting into the recess a first light-transmissive member containing a light diffusing member including at least hollow particles; floating up the hollow particles to a surface of the injected first light-transmissive member; curing the first light-transmissive member; and covering the first light-transmissive member with a second light-transmissive member.

A method of manufacturing a light emitting device according to an embodiment of the present disclosure includes: providing a second precursor including a base member being plate-like, a light emitting element mounted on the base member, and a projection being annular and being formed so as to surround the light emitting element; injecting inner than the projection a first light-transmissive member containing a light diffusing member including at least hollow particles; floating up the hollow particles; curing the first light-transmissive member; and covering the first light-transmissive member with a second light-transmissive member.

Effects of the Invention

The present embodiment renders the object color at the light emitting surface uniform.

BRIEF DESCRIPTION OF THE DRAWINGS

FIG. 1A is a plan view schematically showing a light emitting device according to a first embodiment.

FIG. 1B is a cross-sectional view taken along line IB-IB in FIG. 1A of the light emitting device according to the first embodiment.

FIG. 1C is an enlarged cross-sectional view showing the surface of a light-transmissive member in FIG. 1B of the light emitting device according to the first embodiment.

FIG. 2 is a flowchart of the procedure of a method of manufacturing the light emitting device according to the first embodiment.

FIG. 3A is a cross-sectional view showing providing a first precursor in the method of manufacturing the light emitting device according to the first embodiment.

FIG. 3B is a cross-sectional view showing injecting the first light-transmissive member in the method of manufacturing the light emitting device according to the first embodiment.

FIG. 3C is a cross-sectional view showing floating up a light diffusing member in the method of manufacturing the light emitting device according to the first embodiment.

FIG. 3D is a cross-sectional view showing curing the first light-transmissive member in the method of manufacturing the light emitting device according to the first embodiment.

FIG. 3E is a cross-sectional view showing forming a second light-transmissive member in the method of manufacturing the light emitting device according to the first embodiment.

FIG. 3F is a cross-sectional view showing forming the second light-transmissive member in the method of manufacturing the light emitting device according to the first embodiment.

FIG. 4A is a plan view schematically showing a light emitting device according to a second embodiment.

FIG. 4B is a cross-sectional view taken along line IVB-IVB in FIG. 4A of the light emitting device according to the second embodiment.

FIG. 4C is an enlarged cross-sectional view showing the surface of a light-transmissive member in FIG. 4B of the light emitting device according to the second embodiment.

FIG. 5 is a flowchart of the procedure of a method of manufacturing the light emitting device according to the second embodiment.

FIG. 6A is a cross-sectional view showing providing a second precursor in the method of manufacturing the light emitting device according to the second embodiment.

FIG. 6B is a cross-sectional view showing injecting a first light-transmissive member in the method of manufacturing the light emitting device according to the second embodiment.

FIG. 6C is a cross-sectional view showing floating up a light diffusing member in the method of manufacturing the light emitting device according to the second embodiment.

FIG. 6D is a cross-sectional view showing curing the first light-transmissive member in the method of manufacturing the light emitting device according to the second embodiment.

FIG. 6E is a cross-sectional view showing forming a second light-transmissive member in the method of manufacturing the light emitting device according to the second embodiment.

FIG. 6F is a cross-sectional view showing forming the second light-transmissive member step in the method of manufacturing the light emitting device according to the second embodiment.

In the following, with reference to the drawings as appropriate, a description will be given of embodiments of the invention. Note that, a light emitting device described in the following is for embodying the technical idea of the present invention, and does not limit the present invention thereto. In particular, the dimension, material, shape, relative disposition and the like of the following constituents are merely of an exemplary nature and not intended to limit the scope of the present invention thereto, unless otherwise specified. Note that, the size, positional relationship and the like of members in the drawings may be exaggerated for the sake of clarity. In the following description, an identical or similar member is denoted by an identical name and reference character in principle, and the detailed description thereof may be omitted as appropriate.

(First Embodiment)

FIG. 1A is a plan view schematically showing a light emitting device 100 according to the present embodiment. FIG. 1B is a cross-sectional view taken along line IB-IB in FIG. 1A. FIG. 1C is an enlarged cross-sectional view showing the surface of the first light-transmissive member in FIG. 1B.

The light emitting device 100 includes a light emitting element 1, a first light-transmissive member 3 which covers the light emitting element 1, and a light diffusing member 5 contained in the first light-transmissive member. The light diffusing member 5 contains hollow particles. The surface of the first light-transmissive member 3 has irregular shapes attributed to the light diffusing member 5. The first light-transmissive member 3 is covered with the second light-transmissive member 4. Specifically, the light emitting device 100 includes: a first precursor 10 which includes a base member 2 including a recess 2a including an inner bottom surface 2b and lateral walls 2c, and a light emitting element 1 mounted on the inner bottom surface 2b of the recess 2a; a first light-transmissive member 3 filling up the recess 2a so as to cover the light emitting element 1; a light diffusing member 5 and a fluorescent material 6 contained in the first light-transmissive member 3; and a second light-transmissive member 4 covering the first light-transmissive member 3. The surface of the first light-transmissive member 3 has irregular shapes attributed to the light diffusing member 5. The fluorescent material 6 is higher in density on the light emitting element 1 side in the first light-transmissive member 3 than on the second light-transmissive member 4 side in the first light-transmissive member 3.

(First Precursor)

The first precursor 10 includes: the base member 2 which includes the recess 2a including the inner bottom surface 2b and the lateral walls 2c; wirings 7 disposed at the inner bottom surface 2b of the recess 2a; and the light emitting element 1 mounted on the inner bottom surface 2b of the recess 2a and electrically connected to the wirings 7.

The recess 2a preferably has its lateral walls 2c inclined so as to define an opening greater in the opening direction. The inclination angle preferably falls within a range of 90 degrees to 150 degrees inclusive, further preferably 100 degrees to 130 degrees inclusive, relative to the inner bottom surface 2b. The provision of the inclination makes the fluorescent material 6 contained in the first light-transmissive member 3 less visible as seen in a plan view.

(Light Emitting Element)

The light emitting element 1 is mounted on the base member 2 by face-up mounting through wire bonding using gold wires, silver wire, aluminum wires or the like, or flip-chip bonding using solder, silver paste or the like. The light emitting element 1 mounted on the base member 2 may be one or more than one in number. The light emitting element 1 may be any known light emitting element, for example, preferably a light emitting diode or a laser diode. The light emitting element 1 is electrically connected to the wirings 7 exposed at the inner bottom surface 2b of the recess 2a in the base member 2, and emits light in the wavelength range from ultraviolet light to infrared light. For example, the blue-color or green-color light emitting element 1 may be a nitride-based semiconductor $In_XAl_YGa_{1-X-Y}N$, $0 \leq X$, $0 \leq Y$, $X+Y \leq 1$, GaP or the like. The red-color light emitting element 1 may be, for example, a nitride-based semiconductor element, or GaAlAs, AlInGaP or the like. The light emitting element 1 may be a polygon such as a square, a rectangle, a triangle, or a hexagon, or a circle or an oval as seen in a plan view.

(Base Member)

The base member 2 is equipped with at least one light emitting element 1, and electrically connects the light emitting device 100 to the outside. The base member 2 includes the recess 2a including the inner bottom surface 2b and the lateral walls 2c, and the wirings 7 disposed at the inner bottom surface 2b and/or inside of the recess 2a. The outer shape of the base member 2 as seen in a plan view is substantially square. The base member 2 includes the recess 2a. The shape of the recess 2a as seen in a plan view is substantially square. The material of the base member 2 is preferably high in mechanical strength, and less prone to transmit light from the light emitting element 1 or external light. Specifically, the base member 2 may be formed of resin such as polyphthalamide resin (PPA), phenolic resin, bismaleimide triazine resin (BT resin), epoxy resin, or silicone resin, or ceramic such as $Al_2O_3$ or AlN, or metal such as copper, silver, gold, aluminum or the like. Metal may be coated by an insulating material as appropriate.

The base member 2 may include, at its lower surface, a heat dissipating terminal electrically independent of the light emitting element 1. The heat dissipating terminal is preferably formed to have an area greater than the sum of the upper surface area of every light emitting element 1 of the light emitting device 100, and disposed so as to overlap with the region immediately below the light emitting element 1. The heat dissipating terminal having this structure implements the light emitting device 100 with improved heat dissipation property. While the base member 2 may be white-color which is excellent in light extraction efficiency, at least part of the upper surface of the package is preferably dark-color such as black-color, in order to reduce reflectivity to the external light. Alternatively, the part of the upper surface may be rough for scattering the external light. The inner walls of the recess 2a may also be dark-color for improving display contrast. Alternatively, the inner walls of the recess 2a may be white-color for improving light extraction efficiency.

(Wirings)

The wirings 7 are a pair of wirings 7a, 7b corresponding to the positive and negative polarity. The wirings 7 are disposed as being exposed outside the resin at the inner bottom surface 2b of the recess 2a, with the upper surface of the wiring 7a and the upper surface of the wiring 7b being spaced apart from each other. The wirings 7 are formed by electroplating, for example. The thickness of the wirings 7 may be uniform, or may be partially increased or reduced. The wirings 7 are preferably formed of a material with high thermal conductivity, high mechanical strength, and improved punch-press workability or etching workability. Such a material may be, for example, metal such as copper, aluminum, gold, silver, tungsten, iron, or nickel, or alloy such as iron-nickel alloy or phosphor bronze. The wirings 7 may alternatively be formed by electroless plating, vapor deposition, sputtering or the like.

(First Light-Transmissive Member)

The first light-transmissive member 3 is provided in the recess 2a and covers the light emitting element 1. The first light-transmissive member 3 contains the light diffusing member 5. The surface of the first light-transmissive member 3 has irregular shapes attributed to the light diffusing member 5. The first light-transmissive member 3 contains the fluorescent material 6, and the light diffusing member 5 is positioned nearer to the surface of the first light-transmissive member 3 than the fluorescent material 6 is. Accordingly, by the light diffusing member 5 at the surface of the first light-transmissive member 3 reflecting and diffusing external light such as sunlight or illumination light, the external light becomes less likely to reach the fluorescent material 6 positioned on the light emitting element 1 side of the first light-transmissive member 3. Thus, the object color or the reflected object color of the fluorescent material 6 becomes less visible. That is, the object color of the light emitting surface is whitened. Note that, the surface of the first light-transmissive member 3 refers to the plane of the first light-transmissive member 3 opposing to the inner bottom surface 2b of the recess 2a, and basically is the upper surface of the first light-transmissive member 3. On the other hand, it may include part of the lateral surfaces of the first light-transmissive member 3 continuous to the upper surface.

As shown in FIG. 1C, at the surface of the first light-transmissive member 3, the light diffusing member 5 includes projecting portions A projecting from the first light-transmissive member 3 and covered with the second light-transmissive member 4, and covering portions B where the first light-transmissive member 3 covers the light diffusing member 5. The first light-transmissive member 3 does not necessarily entirely cover the light diffusing member 5. The light diffusing member 5 should be disposed around the surface of the first light-transmissive member 3 so that the surface of the first light-transmissive member 3 has irregular shapes. The light diffusing member 5 is covered with the first light-transmissive member 3 or the second light-transmissive member 4. Accordingly, as compared to the conventional light emitting device obtained by attaching particulates onto the surface of cured silicone resin afterward, the light emitting device 100 according to the embodiment less suffers removal or damage of the particulates because of shock or the like.

The surface of the first light-transmissive member 3 has height variations falling within a range of 2 μm to 5 μm inclusive by the irregular shapes attributed to the light diffusing member 5. The silicone resin which is different in composition has weak adhesion and the interface is weak. Here, the anchoring effect exhibited by the irregular shapes attributed to the light diffusing member 5 facilitates adhesion.

The first light-transmissive member 3 is preferably formed of a material which is well light-transmissive, for example, thermosetting resin, thermoplastic resin or the like. Thermosetting resin may be, for example, silicone resin, silicone modified resin, silicone hybrid resin, epoxy resin, epoxy modified resin, urea resin, diallyl phthalate resin, phenolic resin, unsaturated polyester resin, or hybrid resin containing at least one of the foregoing resins. In particular, silicone resin or modified resin thereof or hybrid resin thereof is preferable for its excellent heat resistance and light resistance. The first light-transmissive member 3 should exhibit a transmittance of 50% or more, preferably 70% or more, further preferably 85% or more.

The height of the surface of the first light-transmissive member 3 is flat. As used herein, being "flat" refers to the radius 1/R of the surface of the first light-transmissive member 3 being 20 (1/μm) or less. Thus, the light diffusing member 5 is disposed to reach the bonding surface with the lateral walls 2c, thereby rendering the fluorescent material 6 less visible.

(Second Light-Transmissive Member)

The second light-transmissive member 4 is formed so as to cover the first light-transmissive member 3, thereby forming a lens. The formed lens condenses light. Thus, light reflected on the lateral walls 2c is extracted, thereby alleviating color unevenness dependent on the angle of the light emitting device. Thus, emitted light color of the light emitting device is expected to appear uniform from −90° direction to 90° direction, where 0° direction is the front side of the light emitting part, −90° direction is a lateral side, and the opposite side is 90°.

The second light-transmissive member 4 is preferably formed of a material which is well light-transmissive, for example, thermosetting resin, thermoplastic resin or the like. Thermosetting resin may be, for example, silicone resin, silicone modified resin, silicone hybrid resin, epoxy resin, epoxy modified resin, urea resin, diallyl phthalate resin, phenolic resin, unsaturated polyester resin, or hybrid resin which contains at least one of the foregoing resins. In particular, silicone resin or modified resin thereof or hybrid resin thereof is preferable for its excellent heat resistance and light resistance. The second light-transmissive member 4 should exhibit a transmittance of 50% or more, preferably 70% or more, further preferably 85% or more. Before filling up the space with the second light-transmissive member 4, the surface of the first light-transmissive member 3 may be plasma-processed in order to improve adhesion.

(Light Diffusing Member)

The light diffusing member 5 contains hollow particulates. In FIG. 1A, the light diffusing member 5 is preferably evenly disposed at the surface of the first light-transmissive member 3. Note that, depending on the size or shape of the hollow particles, they may be irregularly disposed at the surface of the first light-transmissive member 3 in terms of distance from each other or the exposed degree. The light diffusing member 5 is at least partially exposed outside the first light-transmissive member 3. The light diffusing member 5 exposed outside the first light-transmissive member 3 is covered with the second light-transmissive member 4. While the particle diameter of the hollow particles is not particularly specified, it preferably falls within a range of 5

μm to 100 μm inclusive, further preferably 20 μm to 70 μm inclusive, and particularly preferably 45 μm to 65 μm inclusive. Note that, the particle diameter is the median diameter. A smaller particle diameter and a greater volume of the hollow particles provide weaker buoyancy, which makes difficult for the hollow particles to float up in the first light-transmissive member 3. Note that, the hollow particles preferably have a shell thickness falling within a range of 1 μm to 30 μm inclusive, further preferably 5 μm to 20 μm inclusive. A greater void of the hollow particles facilitates the hollow particles' floating up; on the other hand, a smaller shell thickness tends to invite breakage of the particulates. Accordingly, by setting the particle diameter and the shell thickness to fall within such ranges, the hollow particles are facilitated to float up to the surface of the first light-transmissive member 3, and become less prone to be broken. This allows appropriate irregular shapes to be formed at the surface of the first light-transmissive member 3, which irregular shapes facilitate scattering of light and prevent glare at the surface of the first light-transmissive member 3.

The bulk density or the specific gravity of the light diffusing member 5 to the first light-transmissive member 3 preferably falls within a range of 0.1 g/cm$^3$ to 0.7 g/cm$^3$ inclusive, and further preferably the bulk density to the first light-transmissive member 3 falls within a range of 0.1 g/cm$^3$ to 0.2 g/cm$^3$ inclusive. The floating up of the light diffusing member 5 is facilitated as the bulk density to the first light-transmissive member 3 is smaller. When the bulk density is excessively small, the light diffusing member 5 disadvantageously floats up while being dispersed in the first light-transmissive member 3 or is locally positioned in the dispenser, thereby impairing workability. By setting the bulk density to fall within such a range, after the light diffusing member 5 is dispersed in the first light-transmissive member 3, the light diffusing member 5 is allowed to float up to the surface of the first light-transmissive member 3. This facilitates forming the uneven shapes at the surface of the first light-transmissive member 3.

Each piece of light diffusing member 5 preferably has a spherical shape. Such spherical pieces of light diffusing member 5 facilitate evenly forming a plurality of irregular shapes at the surface of the first light-transmissive member 3. The light diffusing member 5 may be white-color hollow particulates, or may be transparent hollow particulates which appear white-color by scattering, because of the difference in refractive index from the surrounding materials. The light diffusing member 5 scatters light emitted by the light emitting element 1, thereby improving the light extraction efficiency of the light emitting device 100. Accordingly, the light diffusing member 5 is preferably formed of a material which is largely different in refractive index from the first light-transmissive member 3. The material of the light diffusing member 5 may be, for example, fine powder of hollow silica, hollow glass, hollow ceramic, fly ash, shirasu balloons, hollow polymer, porous silica, porous polymer and the like. Note that, the light diffusing member 5 may be fine powder of a mixture of a plurality of the foregoing materials. For example, when the first light-transmissive member 3 is formed of silicone resin of which refractive index is 1.50 to 1.55, and the light diffusing member 5 is formed of hollow silica of which refractive index is 1.35 to 1.45, the light extraction efficiency of the light emitting element 1 and the like to the outside improves.

The content of the light diffusing member 5 to the first light-transmissive member 3 preferably falls within a range of 1.56 vol % to 19.3 vol % inclusive, and the content to the first light-transmissive member 3 further preferably falls within a range of 7.3 vol % to 10.6 vol % inclusive. As the content of the light diffusing member 5 is greater, the light emitting surface appears whiter-color. Additionally, an excessively great content of the light diffusing member 5 invites a reduction in luminance of the light emitting device attributed to the reduced transmittance; and an excessively small content thereof lets the object color appearing at the surface of the first light-transmissive member 3 be the object color of the fluorescent material 6. By setting the content of the light diffusing member 5 to the first light-transmissive member 3 to fall within such a range, the light emitting surface appears white-color without inviting a reduction in luminance of the light emitting device. Note that, "vol %" which is the unit of the content of the light diffusing member 5 corresponds to the volume of the first light-transmissive member 3 containing the light diffusing member 5, the fluorescent material 6, and other additive. For example, when the content of the light diffusing member 5 is 10 vol %, it means that the volume of the light diffusing member 5 is 10 cm$^3$ to the total volume of 100 cm$^3$ of the first light-transmissive member 3, the light diffusing member 5, the fluorescent material 6, and other additive.

(Fluorescent Material)

The fluorescent material 6 should be any material that absorbs light from the light emitting element 1 and converts into light of different wavelength. For example, the fluorescent material 6 may be a cerium-activated yttrium-aluminum-garnet (YAG)-based fluorescent material, a cerium-activated lutetium-aluminum-garnet (LAG), a europium and/or chromium-activated nitrogen-containing calcium aluminosilicate ($CaO—Al_2O_3—SiO_2$)-based fluorescent material, a europium-activated silicate (($Sr,Ba)_2SiO_4$)-based fluorescent material, a β-sialon-based fluorescent material, a nitride-based fluorescent material such as $CaAlSiN_3$:Eu (CASN)-based or $(Sr,Ca)AlSiN_3$:Eu(SCASN)-based fluorescent material, a $K_2SiF_6$:Mn(KSF)-based fluorescent material, a sulfide-based fluorescent material and the like. This implements a light emitting device which emits mixed-color light of the primary light and the secondary light of a visible wavelength (for example, white-color-based), or a light emitting device which emits the secondary light of a visible wavelength as being excited by the primary light of ultraviolet light. The fluorescent material 6 may be a combination of a plurality of types of fluorescent materials. The fluorescent materials may be used in a combination or a ratio suitable for the desired hue, to adjust the color rendering or the color reproduction. The density of the fluorescent material 6 on the light emitting element 1 side in the first light-transmissive member 3 is preferably higher than the density of the fluorescent material 6 on the surface side of the first light-transmissive member 3 in the first light-transmissive member 3. The increased density of the fluorescent material 6 on the light emitting element 1 side increases the wavelength conversion rate. Thus, the desired chromaticity is achieved using the fluorescent material 6 of a smaller content.

In the light emitting device 100 according to the present embodiment, utilizing the light diffusing member 5 which is originally added to the first light-transmissive member 3 for controlling light distribution, the particle diameter, the bulk density, and the content of the light diffusing member 5 are adjusted as appropriate, to form the irregular shapes at the surface of the first light-transmissive member 3. Thus, the irregular shapes formed at the surface of the first light-transmissive member 3 effectively scatter external light, to implement the light emitting device 100 of which light emitting surface appears white-color. When a plurality of light emitting elements 1 is provided, the light emitting elements are disposed at a certain interval, and all the light emitting elements 1 in the light emitting device 100 are covered with the light diffusing member 5 as seen in a plan view. Thus, the light diffusing member 5 scattering light emitted from the light emitting elements 1 reduces the difference in lightness between the light emitting part where the light emitting elements 1 exist when turned on and the non-light emitting part where the light emitting elements 1 do not exist. This implements the light emitting device 100 with reduced luminance unevenness when installed in a lighting fixture.

(First Embodiment Manufacturing Method)

Next, with reference to FIG. 2 and FIGS. 3A to 3F, a description will be given of a method of manufacturing the light emitting device according to the first embodiment. The order of part of the steps is not specified, and may be interchanged.

FIG. 2 is a flowchart of the procedure of the method of manufacturing the light emitting device according to the first embodiment. The method of manufacturing the light emitting device according to the first embodiment includes a first precursor providing step S11, a first light-transmissive member injecting step S12, a light diffusing member floating up step S13, a first light-transmissive member curing step S14, and a second light-transmissive member forming step S15.

FIG. 3A is a cross-sectional view showing the providing the first precursor in the method of manufacturing the light emitting device according to the first embodiment. FIG. 3B is a cross-sectional view showing the injecting the first light-transmissive member in the method of manufacturing the light emitting device according to the first embodiment. FIG. 3C is a cross-sectional view showing the floating up the light diffusing member in the method of manufacturing the light emitting device according to the first embodiment. FIG. 3D is a cross-sectional view showing the curing the first light-transmissive member in the method of manufacturing the light emitting device according to the first embodiment. FIGS. 3E and 3F are each a cross-sectional view showing the forming the second light-transmissive member in the method of manufacturing the light emitting device according to the first embodiment.

(First Precursor Providing Step)

What is provided is the first precursor 10 including the base member 2 including the recess 2a and having the light emitting element 1 mounted on the inner bottom surface 2b.

As shown in FIG. 3A, the first precursor providing step S11 is a step of providing the first precursor 10 in which the light emitting element 1 is mounted on the inner bottom surface 2b of the recess 2a of the base member 2 which includes the recess 2a including the inner bottom surface 2b and the lateral walls 2c. In the first precursor providing step S11, the light emitting element 1 is electrically connected to the wirings 7 in the base member 2 by wires or bumps.

(First Light-Transmissive Member Injecting Step)

The first light-transmissive member 3, which contains the light diffusing member 5 including at least hollow particles, is injected into the recess 2a.

As shown in FIG. 3B, the first light-transmissive member injecting step S12 is a step of injecting silicone resin to be the first light-transmissive member 3 into the recess 2a of the base member 2 thereby filling up the recess 2a. In the first light-transmissive member injecting step S12, the light diffusing member 5 is previously added to the silicone resin, and the light diffusing member 5 is evenly dispersed in the silicone resin. The silicone resin is dripped into the recess 2a of the base member 2 by, for example, potting using a dispenser.

As shown in FIG. 3B, in the first light-transmissive member injecting step S12, the silicone resin to which the light diffusing member 5 is added is injected to fill up the recess 2a to the uppermost surface so that the resin becomes flat. Use of the light diffusing member 5 of predetermined particle diameter, bulk density, and content allows in the following step S13 the light diffusing member 5 to float up to reach around the surface of the silicone resin after the light diffusing member 5 is evenly dispersed in the silicone resin. Alternatively, the first light-transmissive member 3 may be formed to have a convex shape bulging from its peripheral part to its central part as shown by the dashed lines.

(Light Diffusing Member Floating Up Step)

The hollow particles are allowed to float up to the surface of the injected first light-transmissive member 3.

As shown in FIG. 3C, the light diffusing member floating up step S13 is a step of allowing the light diffusing member 5 to float up to the surface of the silicone resin. In the light diffusing member floating up step S13, the silicone resin in which the light diffusing member 5 is evenly dispersed is left still for 12 hours at 40° C. The light diffusing member 5 is lighter than silicone resin and has its particle diameter adjusted as described above. Therefore, over the course of time, the light diffusing member 5 gradually floats up through the uncured silicone resin (see arrows in FIG. 3C), and ultimately floats up to reach around the surface of the silicone resin. Thus, at the surface of the silicone resin, irregular shapes attributed to the shape of the light diffusing member 5 are formed.

In the floating up of the hollow particles, the light diffusing member 5 may be left still or may receive vibrations such as ultrasound for a certain time in the first light-transmissive member 3. Applying ultrasonic vibrations to the first light-transmissive member 3 allows the hollow particles to float up quickly and evenly float up. On the other hand, the convex shape of the first light-transmissive member 3 may be slightly flattened.

(First Light-Transmissive Member Curing Step)

The first light-transmissive member 3 is cured.

As shown in FIG. 3D, the first light-transmissive member curing step S14 is a step of curing the silicone resin. In the first light-transmissive member curing step S14, the silicone resin is heated for four hours at 150° C. By the silicone resin being cured by the heating, the light diffusing member 5 having floated up to reach around the surface of the silicone resin is fixed around the surface of the silicone resin, whereby irregular shapes are formed at the surface of the silicone resin. Note that, since irregular shapes for improving adhesion with the second light-transmissive member 4 are formed at the surface of the silicone resin in the following step S15, the heating temperature is preferably adjusted to attain a temperature around 150° C.

(Second Light-Transmissive Member Forming Step)

The first light-transmissive member 3 is covered with the second light-transmissive member 4.

As shown in FIGS. 3E and 3F, the second light-transmissive member forming step S15 is a step of forming the second light-transmissive member 4 so as to cover the first light-transmissive member 3. The second light-transmissive member 4 is formed to have a curved convex shape of which central part is the uppermost surface.

As described above, through the steps, the light emitting device 100 is manufactured. Note that, while the description of the steps has been made of one light emitting device 100, a plurality of light emitting devices 100 in which the base member 2 is continuous may be formed at once, and thereafter singulated to be pieces of light emitting devices 100.

In the method of manufacturing the light emitting device according to the first embodiment, by adjusting the particle diameter, the bulk density, the content and the like as appropriate, the light diffusing member 5 is allowed to float up to reach around the surface of the first light-transmissive member 3. This forms irregular shapes at the surface of the first light-transmissive member 3 attributed to the light diffusing member 5. This realizes the method of manufacturing the light emitting device 100 of which light emitting surface appears white-color. Since the light diffusing member 5 is embedded in the first light-transmissive member 3 or the second light-transmissive member 4, the method provides the light emitting device of which light diffusing member 5 will not be damaged by shock or the like.

(Second Embodiment)

FIG. 4A is a plan view schematically showing a light emitting device 200 according to a second embodiment. FIG. 4B is a cross-sectional view taken along line IVB-IVB in FIG. 4A. FIG. 4C is an enlarged cross-sectional view showing the surface of the first light-transmissive member in FIG. 4B.

The light emitting device 200 includes: a second precursor 20 which includes a plate-like base member 22, a light emitting element 21 disposed on the base member 22, and a projection 28 formed to annularly surround the light emitting element 21; a first light-transmissive member 23 which covers the light emitting element 21; a light diffusing member 25 and a fluorescent material 26 contained in the first light-transmissive member 23; and a second light-transmissive member 24 which covers the first light-transmissive member 23. The light diffusing member 25 contains hollow particles. The surface of the first light-transmissive member 23 has irregular shapes attributed to the light diffusing member 25. The irregular shapes are covered with the second light-transmissive member 24. The fluorescent material 26 is greater in density on the light emitting element 21 side in the first light-transmissive member 23 than on the surface side of the first light-transmissive member 23 in the first light-transmissive member 23.

The first light-transmissive member 23 may be formed to have a convex shape bulging from its peripheral part to the central part. In such a convex shape, the light diffusing member 25 can be densely located about the center of the convex shape and a region where the light diffusing member 25 is absent and flat is formed around the periphery of the convex shape. Thus, the hollow particles are not disposed around the periphery of the convex shape, contributing to improving adhesion to the projection 28. In the following, a description will be given of the structures. Here, since the light emitting element 21, the light diffusing member 25, the fluorescent material 26, and wirings 27 are similar to those according to the first embodiment, the description thereof will not be repeated.

(Second Precursor)

The second precursor 20 includes the flat base member 22, the light emitting element 21 mounted on the base member 22, the projection 28 annularly formed so as to surround the light emitting element 21, and a recess 22a formed of the base member 22 and the projection 28. A plurality of light emitting elements 21 may be provided, and the projection 28 may be provided so as to surround the plurality of light emitting elements 21.

(Base Member)

The base member 22 is equipped with at least one light emitting element 21, and electrically connects the light emitting device 200 to the outside. The base member 22 is plate-like, and includes the wirings 27 disposed at the surface and/or inside. The outer shape of the base member 22 as seen in a plan view is substantially square. The material of the base member 22 may be similar to the base member 2. Similarly to the base member 2, the base member 22 may include, at its lower surface, a heat dissipating terminal electrically independent of the light emitting element 21.

(Projection)

The projection 28 is preferably formed of an insulating material, which less transmits light emitted from the light emitting element 21 or external light. The projection 28 preferably has a predetermined strength. Specifically, the material may be ceramic such as alumina, aluminum nitride, or mullite, or resin such as phenolic resin, epoxy resin, silicone resin, polyimide resin, bismaleimide triazine resin (BT resin), polyphthalamide (PPA), polyamide (PA), or unsaturated polyester. The height of the projection is not particularly specified, and should fall within a range of 0.1 mm to 5 mm inclusive, and preferably 0.3 mm to 2 mm inclusive.

(First Light-Transmissive Member)

The first light-transmissive member 23 is provided in the recess 22a and covers the light emitting element 21. The first light-transmissive member 23 contains the light diffusing member 25. The surface of the first light-transmissive member 23 has irregular shapes attributed to the light diffusing member 25. The first light-transmissive member 23 contains the fluorescent material 26, and the light diffusing member 25 is positioned nearer to the surface of the first light-transmissive member 23 than the fluorescent material 26 is. Accordingly, by the light diffusing member 25 at the surface of the first light-transmissive member 23 reflecting and diffusing external light such as sunlight or illumination light, the external light becomes less likely to reach the fluorescent material 26 positioned on the light emitting element 21 side of the first light-transmissive member 23. Thus, the object color or the reflected object color of the fluorescent material 26 becomes less visible. That is, the object color of the light emitting surface is whitened. Note that, the surface of the first light-transmissive member 23 refers to the plane of the first light-transmissive member 23 opposing to the surface of the base member 22, and basically is the upper surface of the first light-transmissive member 23. On the other hand, it may include part of the lateral surfaces of the first light-transmissive member 23 continuous to the upper surface. The material of the first light-transmissive member 23 may be similar to that of the first light-transmissive member 3.

(Second Light-Transmissive Member)

The second light-transmissive member 24 is provided so as to cover the first light-transmissive member 23, and covers the irregular shapes formed at the first light-transmissive member 3 attributed to the light diffusing member 25. The material of the second light-transmissive member 24 may be similar to that of the second light-transmissive member 24. The second light-transmissive member 24 may be lens-shaped.

(Second Embodiment Manufacturing Method)

Next, with reference to FIG. 5 and FIGS. 6A to 6F, a description will be given of a method of manufacturing the light emitting device according to the second embodiment. The order of part of the steps is not specified, and may be interchanged.

FIG. 5 is a flowchart of the procedure of the method of manufacturing the light emitting device according to the second embodiment. The method of manufacturing the light emitting device according to the second embodiment includes a second precursor providing step S21, a first light-transmissive member injecting step S22, a light diffusing member floating up step S23, a first light-transmissive member curing step S24, and a second light-transmissive member forming step S25.

FIG. 6A is a cross-sectional view showing the providing the second precursor in the method of manufacturing the light emitting device according to the second embodiment. FIG. 6B is a cross-sectional view showing the injecting the first light-transmissive member in the method of manufacturing the light emitting device according to the second embodiment. FIG. 6C is a cross-sectional view showing the floating up the light diffusing member in the method of manufacturing the light emitting device according to the second embodiment. FIG. 6D is a cross-sectional view showing the curing the first light-transmissive member in the method of manufacturing the light emitting device according to the second embodiment. FIGS. 6E and 6F are each a cross-sectional view showing the forming the second light-transmissive member in the method of manufacturing the light emitting device according to the second embodiment.

(Second Precursor Providing Step)

What is provided is the second precursor 20 in which the light emitting element 21 is mounted on the plate-like base member 22 and the annular projection 28 is formed so as to surround the light emitting element 21.

As shown in FIG. 6A, the second precursor providing step S21 is a step of providing the second precursor 20 in which the light emitting element 21 is mounted on the plate-like base member 22 and the annular projection 28 is formed so as to surround the light emitting element 21. In the second precursor providing step S21, the light emitting element 21 is electrically connected to the wirings 27 in the base member 22 by wires or bumps.

(First Light-Transmissive Member Injecting Step)

The first light-transmissive member 23, which contains the light diffusing member 25 including at least hollow particles, is injected inner than the projection 28.

As shown in FIG. 6B, the first light-transmissive member injecting step S22 is a step of injecting silicone resin to be the first light-transmissive member 23 into the recess 22a thereby filling up the recess 22a. In the first light-transmissive member injecting step S22, the light diffusing member 25 is previously added to the silicone resin, and the light diffusing member 25 is evenly dispersed in the silicone resin. The silicone resin is dripped into the recess 22a by, for example, potting using a dispenser.

As shown in FIG. 6B, in the first light-transmissive member injecting step S22, the silicone resin to which the light diffusing member 25 is added is injected to fill up to the uppermost surface of the recess 22a so that the resin becomes flat. Use of the light diffusing member 25 of predetermined particle diameter, bulk density, and content allows in the following step S23 the light diffusing member 25 to float up to reach around the surface of the silicone resin after the light diffusing member 25 is evenly dispersed in the silicone resin. Alternatively, the first light-transmissive member 23 may be formed to have a convex shape bulging from its peripheral part to its central part, in which the part around the recess 22a is the uppermost surface as shown by the dashed lines.

(Light Diffusing Member Floating Up Step)

The hollow particles are allowed to float up.

As shown in FIG. 6C, the light diffusing member floating up step S23 is a step of allowing the light diffusing member 25 to float up to the surface of the silicone resin. In the light diffusing member floating up step S23, the silicone resin in which the light diffusing member 25 is evenly dispersed is left still for 12 hours at 40° C. The light diffusing member 25 is lighter than silicone resin and has its particle diameter adjusted as described above. Therefore, over the course of time, the light diffusing member 25 gradually floats up through the uncured silicone resin (see arrows in FIG. 6C), and ultimately floats up to reach around the surface of the silicone resin. Thus, at the surface of the silicone resin, irregular shapes attributed to the shape of the light diffusing member 25 are formed.

(First Light-Transmissive Member Curing Step)

The first light-transmissive member 23 is cured.

As shown in FIG. 6D, the first light-transmissive member curing step S24 is a step of curing the silicone resin. In the first light-transmissive member curing step S24, the silicone resin is heated for four hours at 150° C. By the silicone resin being cured by the heating, the light diffusing member 25 having floated up to reach around the surface of the silicone resin is fixed around the surface of the silicone resin, whereby irregular shapes are formed at the surface of the silicone resin. Note that, since irregular shapes for improving adhesion with the second light-transmissive member 24 are formed at the surface of the silicone resin in the following step S25, the heating temperature is preferably adjusted to attain a temperature around 150° C.

(Second Light-Transmissive Member Forming Step)

The first light-transmissive member 23 is covered with the second light-transmissive member 24.

As shown in FIGS. 6E and 6F, the second light-transmissive member forming step S25 is a step of forming the second light-transmissive member 24 so as to cover the first light-transmissive member 23. The second light-transmissive member 24 is formed to have a curved convex shape of which central part is the uppermost surface.

As described above, through the steps, the light emitting device 200 is manufactured. Note that, while the description of the steps has been made of one light emitting device 200, a plurality of light emitting devices 200 in which the base member 22 is continuous may be formed at once, and thereafter singulated to be pieces of light emitting devices 200.

In the method of manufacturing the light emitting device according to the second embodiment, by adjusting the particle diameter, the bulk density, the content and the like as appropriate, the light diffusing member 25 is allowed to float up to reach around the surface of the silicone resin. This forms irregular shapes attributed to the light diffusing member 25 at the surface of the silicone resin. This realizes the method of manufacturing the light emitting device of which light emitting surface appears white-color. Since the light diffusing member 25 is at least partially embedded in the silicone resin, the method provides the light emitting device of which light diffusing member 25 will not be damaged by shock or the like.

In the following, a description will be given of examples of the light emitting device of the present disclosure. Note that, the light emitting device of the present disclosure is not specified to the following examples.

(Example 1, Example 2)

Light emitting devices were fabricated according to the method of manufacturing the light emitting device according to the second embodiment.

In the light emitting device of Example 1, the particle diameter of the light diffusing member is 65 μm; the refractive index of the first light-transmissive member is 1.41; the refractive index of the second light-transmissive member is 1.41. In the light emitting device of Example 2, the particle diameter of the light diffusing member is 65 μm; the refractive index of the first light-transmissive member is 1.41; and the refractive index of the second light-transmissive member is 1.55. In order for the light emitting device of Example 1 and that of Example 2 to attain the same emission light color, they each further contain a fluorescent material which provides the emission light color of 5000K and the chromaticity coordinates of (0.328, 0.342).

The details of the constituents of Examples 1 and 2 are as follows.

Light Emitting Element
Number of pieces: mounted by 24 pieces
Type: emit blue-color light of which peak emission wavelength is 455 nm
Outer shape dimension as seen in a plan view: a square having sides each measuring 0.65 mm (longitudinal×lateral)
Height: 150 μm
Base Member
Material: ceramic
Outer shape dimension as seen in a plan view: a square having sides each measuring 15 mm (longitudinal×lateral)
Inner shape dimension as seen in a plan view: a square having sides each measuring 12 mm (longitudinal×lateral)
Height: 2.0 mm Shape: a substantial rectangular prism
First Light-Transmissive Member
Material: methyl silicone resin (product name OE-6351 "Dow Corning Toray Co., Ltd.")
Outer shape dimension as seen in a plan view: a circle having a diameter of 7 mm
Thickness: 500 μm
Curing condition: 40° C.×12 hr+150° C.×4 hr
Second Light-Transmissive Member
Material: methyl silicone resin (product name OE-6351 "Dow Corning Toray Co., Ltd.")
Outer shape dimension as seen in a plan view: a circle having a diameter of 7 mm
Thickness: central part 350 μm
Curing condition: 150° C.×4 hr
Light Diffusing Member
Type: hollow filler
Content: 10.6 vol % to the whole volume including the transmissive member, the fluorescent material, and the light diffusing member
Shape: spherical
Projection
Material: methyl silicone resin containing white-color pigment Outer shape dimension as seen in a plan view: a circle having a diameter of 7 mm
Thickness: 500 μm
Curing condition: 150° C.×15 min (Comparative Example 1)

In order to compare against the light emitting devices of Examples, a light emitting device of Comparative Examples was fabricated.

The light emitting device of Comparative Example 1 does not contain a light diffusing member. The refractive index of the first light-transmissive member is 1.41. Just the first light-transmissive member forms a convex dome shape. Comparative Example 1 was formed similarly to Example 1 except for the content of the light diffusing member to the first light-transmissive member, the shape of the first light-transmissive member, and the absence of the second light-transmissive member. The details of the constituents of Comparative Example 1 are as described above. Note that, since a light emitting device in which no light diffusing member is added to the light-transmissive member and the second light-transmissive member is absent is Comparative Example 1, in the following Table 1, Comparative Example 1 shows blank columns for the light diffusing member particle diameter (μm), the light diffusing member specific gravity (g/cm³), and the second light-transmissive member refractive index.

(Comparative Example 2)

In order to compare against the light emitting device of Examples, a light emitting device of Comparative Example was fabricated.

In the light emitting device of Comparative Example 2, the particle diameter of the light diffusing member is 65 μm; the refractive index of the first light-transmissive member is 1.41; the second light-transmissive member is absent; and the height of the surface of the first light-transmissive member is flat. Comparative Example 2 was formed similarly to Example 1 except for the absence of the second light-transmissive member. The details of the constituents of Comparative Example 2 are as described above. Note that, since a light emitting device in which the second light-transmissive member is absent is Comparative Example 2, in the following Table 1, Comparative Example 2 shows a blank column for the second light-transmissive member refractive index.

The following experiment was conducted on Example 1, Example 2, Comparative Example 1, and Comparative Example 2.

As to Example 1, Example 2, Comparative Example 1, and Comparative Example 2, the object color was measured using a fast-speed spectrophotometric colorimeter (product name "CMS-35PS", available from Murakami Color Research Laboratory).

Table 1 shows the evaluation result.

Table 1 is a table on, for each of Example 1, Example 2, Comparative Example 1, and Comparative Example 2, the light diffusing member content (vol %), the light diffusing member particle diameter (μm), the light diffusing member specific gravity (g/cm³), the first light-transmissive member refractive index, the second light-transmissive member refractive index, the object color (x, y), the color dispersion ΔTcp(K), and the luminous flux (%).

TABLE 1

|  | Light diffusing member content (vol %) | Light diffusing member particle diameter (μm) | Light diffusing member specific gravity (g/cm³) | First light-transmissive member refractive index | Second light-transmissive member refractive index | Object color (x, y) | Color dispersion ΔTcp (K) | Luminous flux (%) |
|---|---|---|---|---|---|---|---|---|
| Example 1 | 10.6 | 65 | 0.13 | 1.41 | 1.41 | (0.375, 0.432) | 364 | 96.0 |
| Example 2 | 10.6 | 65 | 0.13 | 1.41 | 1.55 | (0.377, 0.434) | 662 | 95.2 |

TABLE 1-continued

|  | Light diffusing member content (vol %) | Light diffusing member particle diameter (μm) | Light diffusing member specific gravity (g/cm³) | First light-transmissive member refractive index | Second light-transmissive member refractive index | Object color (x, y) | Color dispersion ΔTcp (K) | Luminous flux (%) |
|---|---|---|---|---|---|---|---|---|
| Comparative Example 1 | 0 | | | 1.41 | | (0.430, 0.511) | 167 | 100 |
| Comparative Example 2 | 10.6 | 65 | 0.13 | 1.41 | | (0.377, 0.432) | 671 | 98.2 |

The chromaticity coordinates of the object color were (0.375, 0.432) in Example 1, and (0.430, 0.511) in Comparative Example 1. That is, in Comparative Example 1, while the emission light color was white, the object color was yellow. This is because of the color of the fluorescent material being visible. On the other hand, in Example 1, both the emission light color and the object color were white.

Accordingly, the light emitting device including the light-transmissive member containing the light diffusing member and the light emitting device including the light-transmissive member without any light diffusing member appear in different hue, even though they emit light in the same color. That is, the hollow structure of the light diffusing member disposed at a higher level than the fluorescent material on the bottom surface of the light-transmissive member scatters external light.

The color dispersion ΔTcp was 364 (K) in Example 1, and 671 (K) in Comparative Example 2. That is, provision of the second light-transmissive member improves the color dispersion as compared to the light emitting device which includes just the first light-transmissive member and of which surface is flat.

In the light emitting device including the first light-transmissive member without containing any light diffusing member, the difference in lightness between the light emitting part where the light emitting element exists when turned on and the non-light emitting part where the light emitting element does not exist was apparent. On the other hand, in the light emitting device including the first light-transmissive member containing the light diffusing member, by the light diffusing member scattering light, the difference in lightness between the light emitting part and the non-light emitting part was less apparent. That is, the layer of the light diffusing member formed at the surface of the first light-transmissive member reduces the luminance unevenness when the light emitting device is turned on.

In the foregoing, while the present disclosure has been specifically described in the modes for carrying out the invention, the spirit of the present disclosure is not limited thereto, and must be construed broadly according to the scope of claims. It goes without saying that the spirit of the present disclosure also covers various modifications and changes according to the embodiments.

INDUSTRIAL APPLICABILITY

The light emitting device according to the embodiments of the present disclosure is applicable to any illumination or the backlight for a liquid crystal panel.

DESCRIPTION OF REFERENCE SIGNS 1, 21: light emitting element
2, 22: base member
2a, 22a: recess
2b, 22b: inner bottom surface
2c: lateral wall
3, 23: first light-transmissive member
4, 24: second light-transmissive member
5, 25: light diffusing member
6, 26: fluorescent material
7, 7a, 7b, 27: wirings
10: first precursor
20: second precursor
28: projection
100, 200 light emitting device
A: exposed portion
B: covering portion

The invention claimed is:
1. A light emitting device comprising:
a light emitting element;
a first light-transmissive member covering the light emitting element; and
light diffusing particles contained in the first light-transmissive member, wherein
the light diffusing particles comprise hollow particles,
the first light-transmissive member has a surface with irregular shapes attributed to the light diffusing particles, and
the first light-transmissive member is covered with a second light-transmissive member, and
some of the light diffusing particles are exposed outside the first light-transmissive member surface with irregular shapes and are covered by the second light-transmissive member.
2. The light emitting device according to claim 1, wherein the surface of the first light-transmissive member has a convex shape bulging from its peripheral part to its central part.
3. The light emitting device according to claim 1, wherein the first light-transmissive member further contains a fluorescent material, and
the fluorescent material has a density that is higher in a first portion on a side of the first light-transmissive member including the light emitting element than in a second portion on a side of the first light-transmissive member adjacent to the second light-transmissive member.
4. The light emitting device according to claim 1, wherein the light diffusing particles have a particle diameter that falls within a range of 20 μm to 70 μm inclusive.
5. The light emitting device according to claim 1, wherein a bulk density of the light diffusing particles with respect to the first light-transmissive member falls within a range of 0.1 g/cm³ to 0.7 g/cm³ inclusive.

6. The light emitting device according to claim 1, wherein
the light emitting device includes a base member that includes a recess that includes an inner bottom surface and lateral walls, and
the light emitting element is mounted on the inner bottom surface of the recess.

7. The light emitting device according to claim 6, wherein the base member is plate-like, and the recess is disposed within an annular projection formed on the base member.

8. The light emitting device according to claim 1, wherein the hollow particles are spherical.

9. The light emitting device according to claim 1, wherein a plurality of the light emitting elements is provided.

10. The light emitting device according to claim 1, wherein a base material of the first light-transmissive member is silicone resin.

11. The light emitting device according to claim 1, wherein a base material of the second light-transmissive member is silicone resin.

12. A method of manufacturing the light emitting device according to claim 1, comprising:
providing a precursor including a base member including a recess having an inner bottom surface, and the light emitting element mounted on the inner bottom surface;
injecting into the recess the first light-transmissive member containing the light diffusing particles including at least the hollow particles;
floating up the hollow particles to a surface of the injected first light-transmissive member;
curing the first light-transmissive member; and
covering the first light-transmissive member with the second light-transmissive member.

13. The method of manufacturing a light emitting device according to claim 12, wherein a surface of the first light-transmissive member is formed to have a convex shape bulging from its peripheral part to its central part.

14. A method of manufacturing the light emitting device according to claim 1, comprising:
providing a precursor including a base member being plate-like, the light emitting element mounted on the base member, and an annular projection formed so as to surround the light emitting element;
injecting into the annular projection interior the first light-transmissive member containing the light diffusing particles including at least the hollow particles;
floating up the hollow particles;
curing the first light-transmissive member; and
covering the first light-transmissive member with the second light-transmissive member.

* * * * *